US005545979A

United States Patent [19]

Nukui et al.

[11] Patent Number: 5,545,979

[45] Date of Patent: Aug. 13, 1996

[54] POWER SOURCE DEVICE FOR WATTHOUR METER

[75] Inventors: Tadashi Nukui; Ken Tanabe, both of Kanagawa-ken, Japan

[73] Assignee: Kabushiki Kaisha Toshiba, Kawasaki, Japan

[21] Appl. No.: 521,586

[22] Filed: Aug. 30, 1995

[30] Foreign Application Priority Data

Sep. 2, 1994 [JP] Japan .................................... 6-209534

[51] Int. Cl.[6] ................................ G05F 3/16; G01R 7/00

[52] U.S. Cl. ........................................... 323/313; 324/142

[58] Field of Search .................................... 323/312, 313, 323/314; 327/530, 535, 538, 539; 324/98, 111, 114, 142

[56] References Cited

U.S. PATENT DOCUMENTS

| | | | |
|---|---|---|---|
| 4,535,287 | 8/1985 | Milkovic | 324/142 |
| 4,542,331 | 9/1985 | Boyer | 323/313 |
| 4,682,102 | 7/1987 | Milkovic | 324/142 |
| 4,998,061 | 3/1991 | Voiisine et al. | 324/142 |
| 5,352,972 | 10/1994 | Pernici et al. | 323/313 |
| 5,373,227 | 12/1994 | Keeth | 323/313 |
| 5,384,740 | 1/1995 | Etoh et al. | 365/189.09 |

FOREIGN PATENT DOCUMENTS

| | | |
|---|---|---|
| 256000 | 4/1988 | Germany . |
| WO85/01134 | 3/1985 | WIPO . |

*Primary Examiner*—Matthew V. Nguyen

*Attorney, Agent, or Firm*—Oblon, Spivak, McClelland, Maier & Neustadt, P.C.

[57] ABSTRACT

A power source device including, a primary reference voltage generating device having a positive power source terminal connected to receive one of ground potential and a DC positive voltage and a negative power source terminal connected to receive a primary DC negative voltage for generating a primary reference voltage, a reference voltage generating device having a positive power source terminal connected to receive the DC positive voltage and a negative power source terminal connected to receive the primary reference voltage for generating a reference voltage, a positive voltage generating device for obtaining a difference between the reference voltage and the primary reference voltage and amplifying the difference to generate the DC positive voltage, a negative voltage generating device for inverting amplifying the DC positive voltage to generate a negative DC voltage, and an integrated circuit having a positive power source terminal connected to receive the DC positive voltage and a negative power source terminal connected to receive the DC negative voltage. The integrated circuit and the reference voltage generating device are integrated and formed on a n-type substrate, and the negative power source terminal of the integrated circuit is isolated from the negative power source terminal of the reference voltage generating device.

6 Claims, 6 Drawing Sheets

POWER SOURCE DEVICE FOR WATTHOUR METER

BACKGROUND OF THE INVENTION

1. Field of the Invention

This invention relates to a power source device, and more particularly to a power source device used for such as a watthour meter.

2. Description of the Related Art

FIG. 7 shows a prior art example of such a power source device.

In this Figure, this power source device is equipped with: a terminal VP1 that inputs a primary DC positive voltage vp1 of positive polarity obtained by rectifying and smoothing AC voltage, a terminal VM1 that inputs a primary DC negative voltage vm1 of negative polarity obtained by rectifying and smoothing AC voltage, a terminal GND that inputs a ground potential gnd, a reference voltage generating device 11 that generates a reference voltage vref, a positive voltage generating device 12 that generates a positive-polarity stabilized DC positive voltage vp2, and a negative voltage generating device 13 that generates a negative-polarity stabilized DC negative voltage vm2.

Reference voltage generating device 11 generates reference voltage vref, taking as the positive power source voltage primary DC positive voltage vp1 and as negative power source voltage ground potential gnd.

Positive voltage generating device 12 is equipped with an operational amplifier OP1, a resistor R11, and a resistor R12, to constitute a noninverting amplifier. Positive voltage generating device 12 applies noninverting amplification to reference voltage vref supplied from reference voltage generating device 11, to generate DC positive voltage vp2 as follows.

$$vp2=(1+R2/R1)\times vref$$

This DC positive voltage vp2 is output from a terminal VP2.

Negative voltage generating device 13 is equipped with an operational amplifier OP12, a resistor R16, and a resistor R17, to constitute an inverting amplifier. Negative voltage generating device 13 applies inverting amplification to DC positive voltage vp2 supplied from positive voltage generating device 12, to generate DC negative voltage vm2 as follows.

$$vm2=(-1)\times R7/R6\times vp2$$

This DC negative voltage vm2 is output from a terminal VM2. The above-described power source device is connected to a LSI 5 which constitutes a part of a watthour meter, such that as the positive and negative power sources DO positive voltage vp2 and DC negative voltage vm2 are applied, respectively.

However, with the conventional power source device, in the case where reference voltage generating device 11 and LSI 5 (that employs as the positive power source DC positive voltage vp2, and as negative power source DC negative voltage vn2) are integrated with a view to cost reduction, the power source of reference voltage generating device 11 has to be isolated from the power source of LSI 5. In order to isolate the power sources of reference voltage generating device 11 and LSI 5, it is necessary to make an LSI 10B a twin tab process as shown in FIG. 8, or to make it by a triple well process as shown in FIG. 9 or FIG. 10, and this in fact ends up increasing costs.

SUMMARY OF THE INVENTION

Accordingly, one object of this invention is to provide a power source device which is easy to manufacture with a simple construction.

Another object of this invention is to provide a power source device whereby cost reduction can be achieved with a simple construction.

These and other objects of this invention can be achieved by providing a power source device including, a primary reference voltage generating device having a positive power source terminal connected to receive one of ground potential and a DC positive voltage and a negative power source terminal connected to receive a primary DC negative voltage for generating a primary reference voltage, a reference voltage generating device having a positive power source terminal connected to receive the DC positive voltage and a negative power source terminal connected to receive the primary reference voltage for generating a reference voltage, a positive voltage generating device connected to receive the reference voltage and the primary reference voltage for obtaining a difference between the reference voltage and the primary reference voltage and amplifying the difference to generate the DC positive voltage, a negative voltage generating device connected to receive the DC positive voltage for inverting amplifying the DC positive voltage to generate a negative DC voltage, and an integrated circuit having a positive power source terminal connected to receive the DC positive voltage and a negative power source terminal connected to receive the DC negative voltage. The integrated circuit and the reference voltage generating device are integrated and formed on a n-type substrate, and the negative power source terminal of the integrated circuit is isolated from the negative power source terminal of the reference voltage generating device.

According to one aspect of this invention, there can be achieved by providing a power source device including a primary reference voltage generating device having a positive power source terminal connected to receive a primary DC positive voltage end a negative power source terminal connected to receive one of ground potential and a DC negative voltage for generating a primary reference voltage, a reference voltage generating device having a positive power source terminal connected to receive the primary reference voltage and a negative power source terminal connected to receive the DC negative voltage for generating a reference voltage, a negative voltage generating device connected to receive the reference voltage and the DC negative voltage for obtaining a difference between the reference voltage and the DC negative voltage and amplifying the difference to generate the DC negative voltage, a positive voltage generating device connected to receive the DC negative voltage for inverting amplifying the DC negative voltage to generate a positive DC voltage, and an integrated circuit having a positive power source terminal connected to receive the DC positive voltage and a negative power source terminal connected to receive the DC negative voltage. The integrated circuit and the reference voltage generating device are integrated and formed on a p-type substrate, and the positive power source terminal of the integrated circuit is isolated from the positive power source terminal of the reference voltage generating device.

According to this invention recited in claim 1, the primary reference generating device is supplied with the primary DC negative voltage and thereby generates the primary reference voltage. The reference voltage generating device is supplied with the primary reference voltage and thereby generates the reference voltage. The positive voltage generating device amplifies the difference between the reference voltage and the primary reference voltage and thereby generates the DC positive voltage. The negative voltage generating device performs inverting amplification on the DC positive voltage, thereby generating the DC negative voltage. At this point, the positive voltage sources of the integrated circuit and reference voltage generating device are both DC positive voltage. Also, the negative power source of the integrated circuit is the DC negative voltage, and the negative power source of the reference voltage generating device is the primary reference voltage, i.e. these negative power source are different. However, since these negative power sources are isolated, there is no possibility of the DC negative voltage and the primary reference voltage getting into a short-circuited condition. In this way, the integrated circuit and the reference voltage generating device can be integrated with an uncomplicated construction.

Also, according to this invention recited in claim 4, the primary reference generating device is supplied with the primary DC positive voltage, thereby generating the primary reference voltage. The reference voltage generating device is supplied with the primary reference voltage, thereby generating the reference voltage. The negative voltage generating device amplifies the difference between the reference voltage and the DC negative voltage and thereby generates the DC negative voltage. The positive voltage generating device performs inverting amplification on the DC negative voltage, thereby generating the DC positive voltage. At this point, the negative power sources of the integrated circuit and the reference voltage generating device are both the DC negative voltage. Also, the positive voltage source of the integrated circuit is the DC positive voltage and the positive voltage source of the reference voltage generating device is the primary reference voltage, i.e. these positive power sources are different. However, these positive power sources are isolated, so there is no possibility of the DC positive voltage and the primary reference voltage getting into a short circuited condition. In this way, the integrated circuit and the reference voltage generating device can be integrated with an uncomplicated construction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
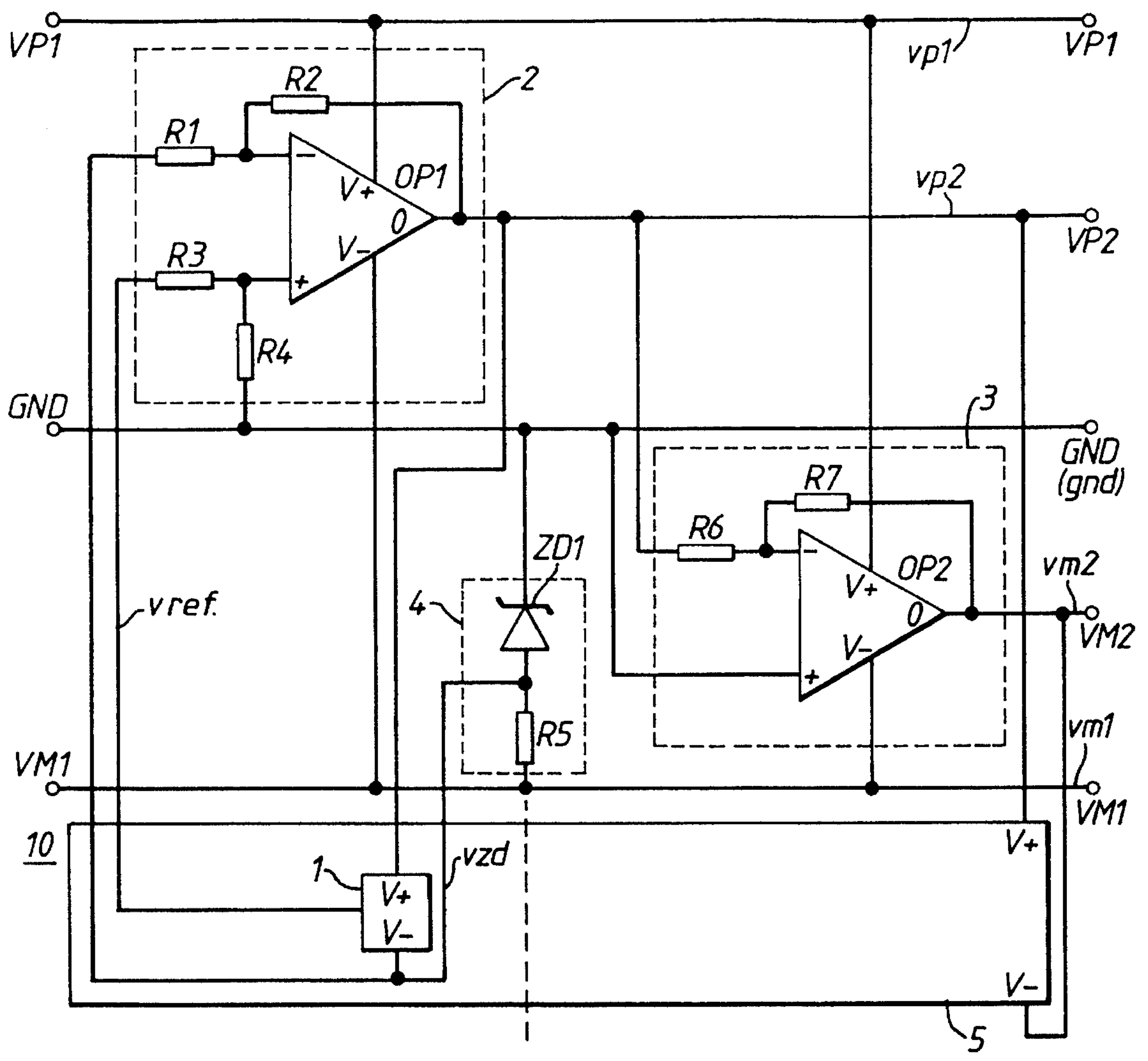
FIG. 1 is a circuit diagram showing a power source device according to a first embodiment of this invention.

Referring now to the drawings, wherein like reference numerals designate identical or corresponding parts throughout the several views, the embodiments of this invention will be described below.

FIG. 1 is a circuit diagram showing a power source device according to a first embodiment of this invention.

The power source device shown in this Figure is provided with: terminal VP1 that inputs positive-polarity primary DC positive voltage vp1 obtained by rectifying and smoothing AC voltage; terminal VM1 that inputs primary DC negative voltage vm1 of negative polarity obtained by rectifying and smoothing AC voltage; terminal GND that inputs ground potential gnd; and a primary reference voltage generating device 4 that generates a primary reference voltage vzd. In addition, this power source device is provided with a LSI 10 including LSI 5 and a reference voltage generating device 1 that generates reference voltage vref; a positive voltage generating device 2 that generates DC positive voltage vp2 that is stabilized and is of positive polarity; and a negative voltage generating device 3 that generates DC negative voltage vm2 that is stabilized and is of negative polarity. In LSI 10, reference voltage generating device 1 is integrated with LSI 5 formed on the n-type substrate, and its negative power source is isolated from the negative power source-of LSI 5.

Primary reference voltage generating device 4 is equipped with a Zener diode ZD1 and a resistor R5. Primary reference voltage vzd is generated from primary reference voltage generating device 4 as the positive power source voltage becomes ground voltage gnd and the negative power source voltage becomes primary DC negative voltage vm1; when primary DC negative voltage vm1 is supplied to terminal VM1.

Reference voltage generating device 1 generates reference voltage vref as the positive power source voltage becomes ground potential gnd and the negative power source voltage becomes primary reference voltage vzd, when reference voltage generating device 1 is supplied with primary reference voltage vzd from primary reference voltage generating device 4. At this point, the output voltage of positive voltage generating device 2 is equal to ground potential gnd.

Positive voltage generating device 2 is equipped with an operational amplifier OP1, a resistor R1, a resistor R2, a resistor R3 and a resistor R4 to constitute a differential amplifier. Positive voltage generating device 2 generates DC positive voltage vp2 as follows by amplifying the difference between reference voltage vref supplied from reference voltage generating device 1 and primary reference voltage vzd supplied from primary-reference voltage generating device 4.

$$vp2=R2/R1\times(vref-vzd)$$

Here, it is assumed that R1=R3 and R2=R4. This DC positive voltage vp2 is output from terminal VP2.

Negative voltage generating device 3 is equipped with an operational amplifier OP2, a resistor R6 and a resistor R7 to constitute an inverting amplifier. Negative voltage generating device 3 generates DC negative voltage vm2 as follows by performing inverting amplification on DC positive voltage vp2 supplied from positive voltage generating device 2.

$$vm2=-1\times R7/R6\times vp2$$

Figure 2:
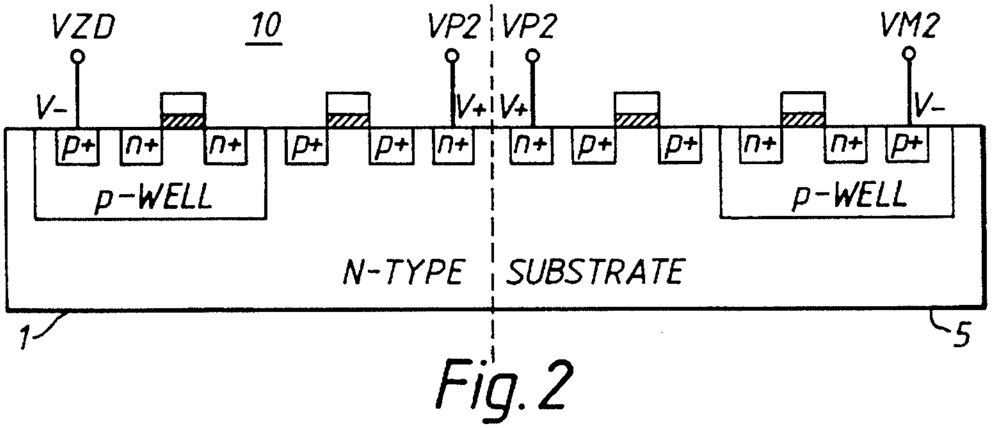
FIG. 2 is a cross-sectional view of LSI 10 in FIG. 1.

This DC negative voltage vm2 is output from terminal VM2. FIG. 2 shows a cross-sectional view of LSI 10 in which LSI 5 and reference voltage generating device 1 are integrated. The positive power source voltages of LSI 5 and reference voltage generating device 1 both become DC positive voltage vp2. The negative power source voltage of LSI 5 is DC negative voltage vm2, while the negative power source voltage of reference voltage generating device 1 is primary reference voltage vzd, i.e. these are different. Since these negative power sources are isolated, however there is no possibility of DC negative voltage vm2 and primary reference voltage vzd getting into a short circuited condition.

Figure 7:
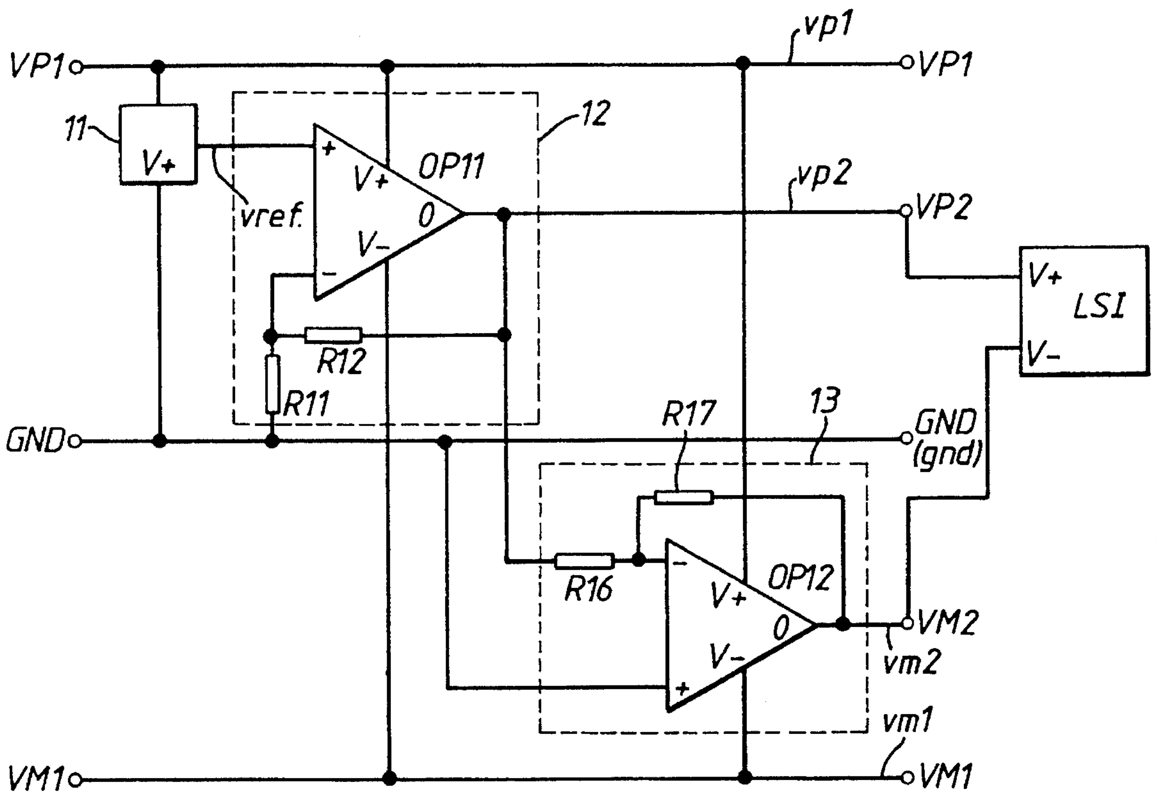
Fig. 7 (PRIOR ART)
FIG. 7 is a circuit diagram showing an example of a prior art power source device.
Figure 8:
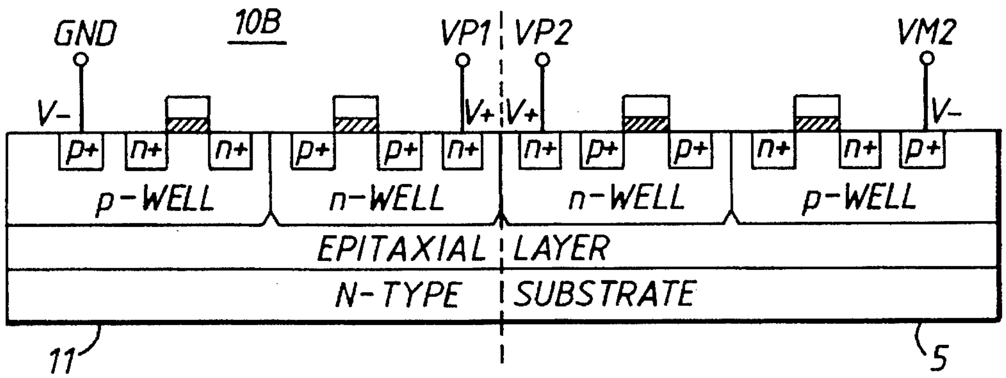
Fig. 8 (PRIOR ART)
FIG. 8 is a cross-sectional view of LSI 10B made by a typical twin process.
Figure 9:
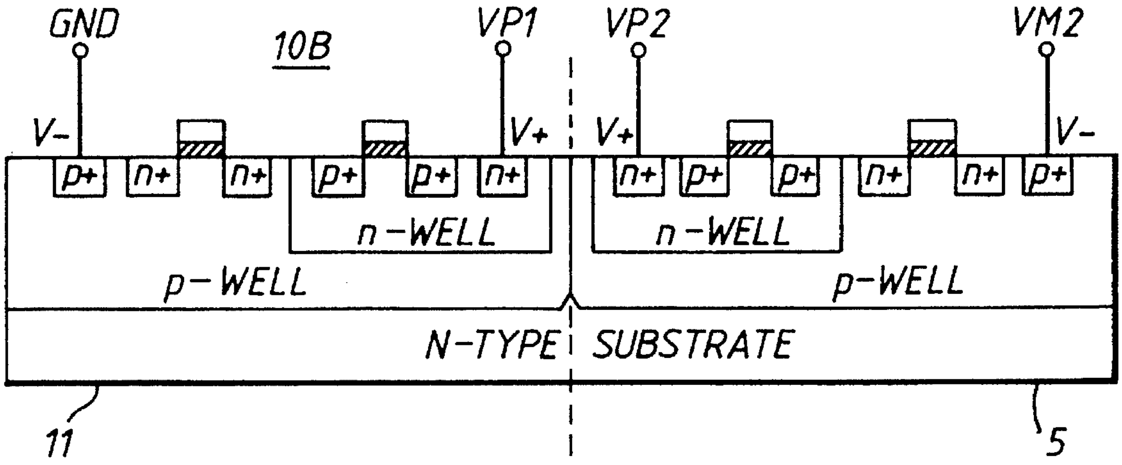
Fig. 9 (PRIOR ART)
FIG. 9 is a cross-sectional view of LSI 10B made by a typical triple well process.
Figure 10:
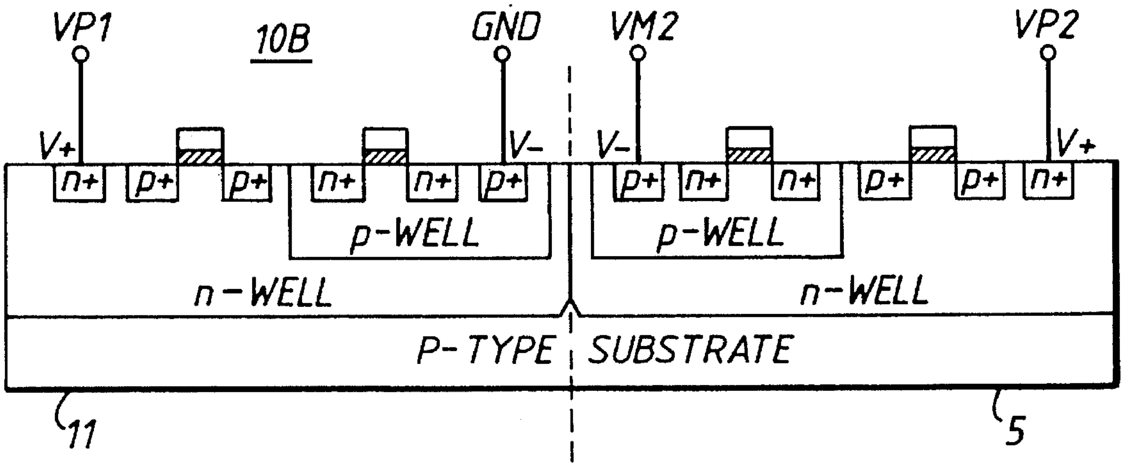
Fig. 10 (PRIOR ART)
FIG. 10 is a cross-sectional view of LSI 10B made by typical triple well process.

With the embodiment described above, integration of LSI 5 and reference voltage generating device 1 into LSI 10 can easily be achieved. Comparing the circuit construction of the power source device shown in FIG. 1 with that of the prior art power source device shown in FIG. 7, primary reference voltage generating device 4 is newly added. But the production cost of primary reference voltage generating device 4 is much smaller than that of reference voltage generating device 1. On the other hand, the production cost of LSI 10 is almost the same as that of LSI 5. Accordingly, according to this embodiment, almost the same production cost as that of reference voltage generating device 1 can be reduced, so that the cost reduction of the power source device is possible.

Figure 3:
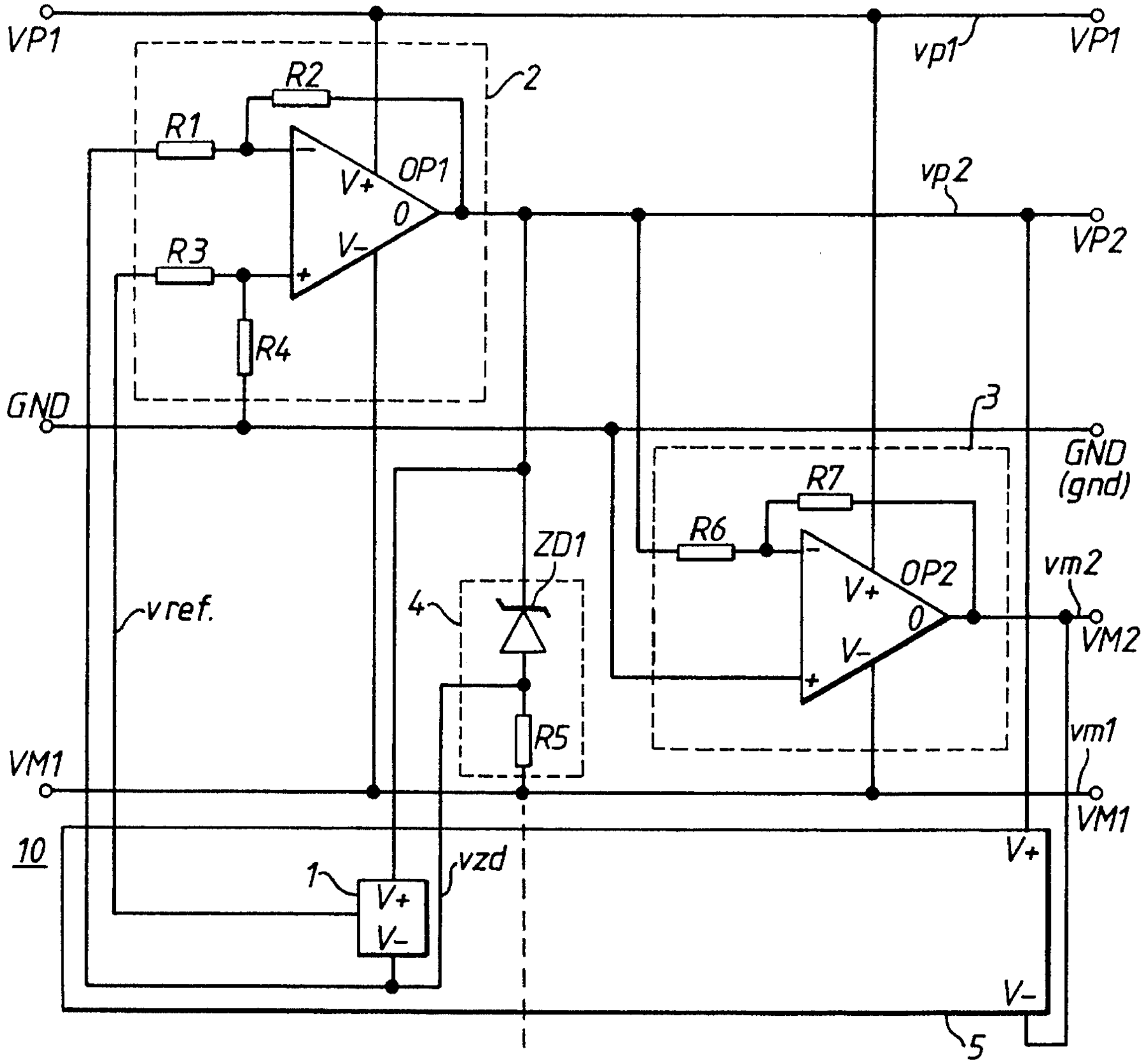
FIG. 3 is a circuit diagram showing a power source device according to a second embodiment of this invention.

FIG. 3 is a circuit diagram showing a power source device according to a second embodiment of this invention.

The difference between this embodiment and the first embodiment lies in that the positive power source of primary reference voltage generating device 4 is obtained by connecting to the output of positive voltage generating device 2. Primary reference voltage generating device 4 is supplied with primary DC negative voltage vm1 at terminal VM1, the positive power source voltage thereof therefore becomes ground potential gnd while the negative power source voltage thereof becomes primary DC negative voltage vm1. Primary reference voltage vzd is thereby generated from primary reference voltage generating device 4. The output voltage of positive voltage generating device 2 is then equal to ground potential gnd.

Reference voltage generating device 1 is supplied with primary reference voltage vzd from primary reference voltage generating device 4. As a result, the positive power source voltage becomes ground potential gnd and the negative power source voltage becomes primary reference voltage vzd, reference voltage vref is thereby generated from reference voltage generating device 1. At this point, the output voltage of positive voltage generating device 2 is equal to ground potential gnd.

Positive voltage generating device 2 is equipped with operational amplifier OP1, resistor R1, resistor R2, resistor R3 and resistor R4 to constitute a differential amplifier. Positive voltage generating device 2 generates DC positive voltage vp2 as follows by amplifying the difference between reference voltage vref supplied from reference voltage generating device 1 and primary reference voltage vzd supplied from primary reference voltage generating device 4.

$$vp2=R2/R1\times(vref-vzd)$$

Here, it is assumed that R1=R3 and R2=R4. This DC positive voltage vp2 is output from terminal VP2. At this point, the positive power source voltage of primary reference voltage generating device 4 changes to DC positive voltage vp2 from ground potential gnd, and the primary reference voltage changes from voltage vzd to voltage (vp2+vzd). The positive power source voltage of reference voltage generating device 1 changes to DC positive voltage vp2 from ground potential gnd, the negative power source voltage thereof becomes voltage (vp2+vzd), and the reference voltage thereof becomes voltage (vp2+vref). Positive voltage generating device 2 generates DG positive voltage vp2 as follows by amplifying the difference between reference voltage (vp2+vref) supplied from reference voltage generating device 1 and primary reference voltage (vp2+vzd) supplied from primary reference voltage generating device 4.

$$vp2=R2/R1\times\{(vp2+vref)-(vp2+vzd)\}=R2/R1\times(vref-vzd)$$

Here, it is assumed that R1=R3 and R2=R4. Consequently, there is no change in the output voltage of positive voltage generating device 2.

Practically the same benefits as in the case of the first embodiment described above can therefore be achieved.

Here, in the first embodiment, in order to make LSI 10 difficult to latch up, the value of primary reference voltage vzd must be made (vzd=vm2) so as to make the negative power source voltage of the reference voltage generating device 1 and the negative power source voltage of LSI 5 equal. However, when the output voltage of positive voltage generating device 2 is equal to ground potential gnd, the difference between the positive power source voltage and the negative power source voltage of reference voltage generating device 1 becomes (gnd−vm2), so the power source voltage difference is small. It is therefore not easy to make the negative power source voltage of the reference voltage generating device 1 and the negative power source voltage of LSI 5 equal.

In contrast to the above-described first embodiment, in the second embodiment, in order to make it difficult for LSI 10 to latch up, it may be arranged for the value of primary reference voltage vzd to be (vzd=vm2−vp2), so as to make the negative power source voltage of reference voltage generating device 1 and the negative power source voltage of LSI 5 equal. By doing this, even when the output voltage of positive voltage generating device 2 is equal to ground potential gnd, the difference between the positive power source and negative power source of reference voltage generating device 1 is (vp2−vm2). As the power source voltage difference is sufficiently large, therefore, reference voltage generating device 1 can operate more normally. Consequently, the negative power source voltage of reference voltage generating device 1 and the negative power source voltage of LSI 5 can be made equal, so it can be made difficult for LSI 10 to latch up.

Figure 4:
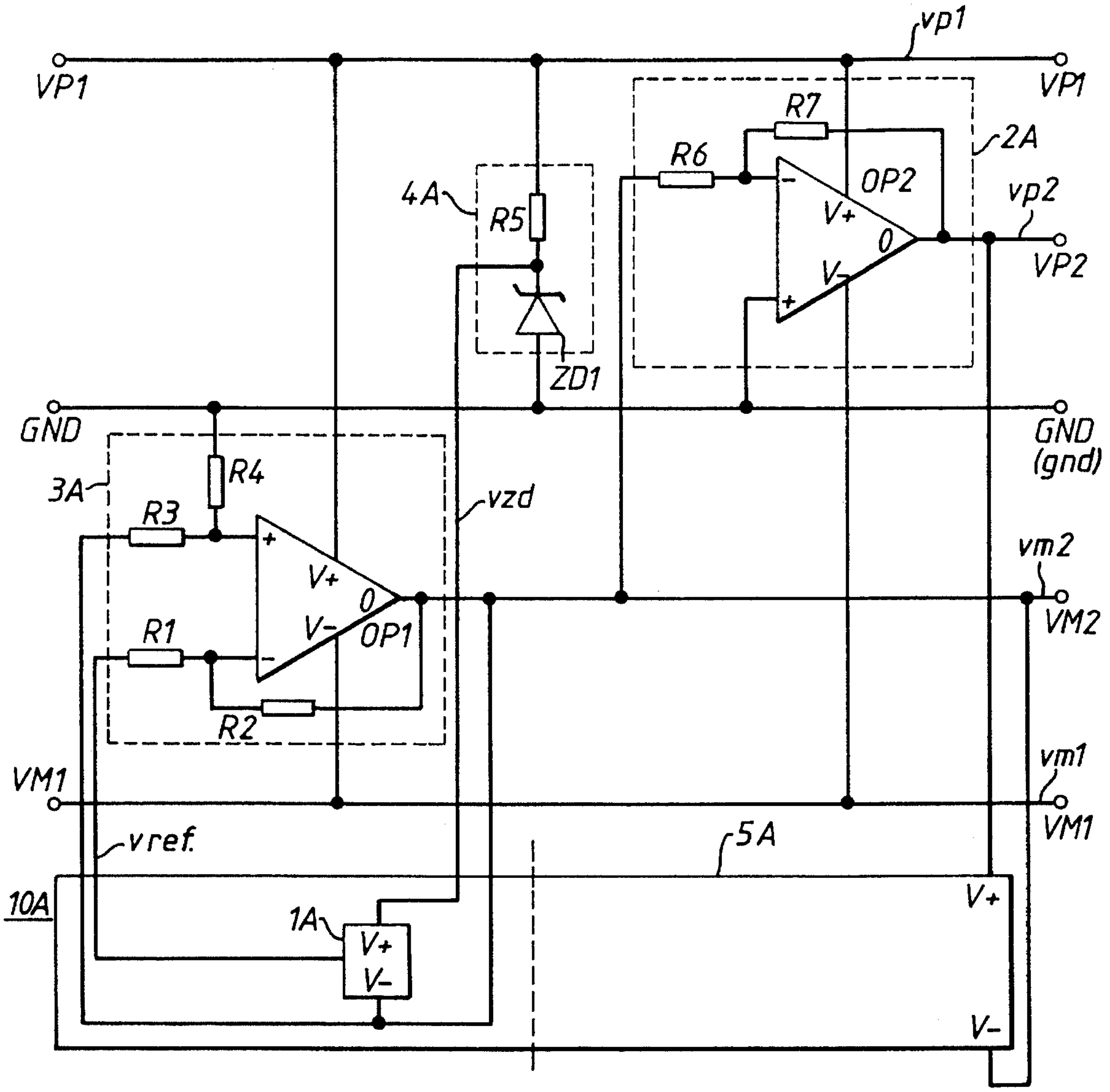
FIG. 4 is a circuit diagram showing a power source device according to a third embodiment of this invention.

FIG. 4 is a circuit diagram showing a power source device according to a third embodiment of this invention.

The power source device in FIG. 4 is equipped with: terminal VP1 that inputs positive-polarity primary DC positive voltage vp1 obtained by rectifying and smoothing AC voltage; terminal VM1 that inputs negative-polarity primary DC negative voltage vm1 obtained by rectifying and smoothing AC voltage; terminal GND that inputs ground potential gnd; and a primary reference voltage generating device 4A that generates primary reference voltage vzd. This power source device is further provided with a LSI 10A including a LSI 5A and a reference voltage generating device 1A that generates reference voltage vref, wherein reference voltage generating device 1A is integrated with LSI 5A formed on the p-type substrate, its positive power source is isolated from the positive power source of LSI 5A; negative voltage generating device 3A that generates DC negative voltage vm2 that is stabilized and of negative polarity; and a positive voltage generating device 2A that generates DC positive voltage vp2 that is stabilized and of positive polarity.

Primary reference voltage generating device 4A is equipped with Zener diode ZD1 and resistor R5. Primary DC positive voltage vp1 is supplied to terminal VP1 thereby making the positive power source voltage thereof become the primary DC positive voltage vp1 and the negative power source voltage thereof become ground potential gnd. Primary reference voltage vzd is thereby generated from primary reference voltage generating device 4A.

Reference voltage generating device 1A is supplied with primary reference voltage vzd from primary reference voltage generating device 4A, this causes the positive power source voltage thereof to become primary reference voltage vzd and the negative power source voltage thereof to become ground potential gnd, and reference voltage vref is thereby generated from reference voltage generating device 1A. The output of negative voltage generating device 3 is then equal to ground potential gnd.

Negative voltage generating device 3A is equipped with operational amplifier OP1, resistor R1, resistor R2, resistor R3 and resistor R4 to constitute a differential amplifier. Negative voltage generating device 3A amplifies the difference between reference voltage vref supplied from reference voltage generating device 1A and its own output voltage vm2, thereby generating DC negative voltage vm2.

First of all, DC negative voltage vm2 is generated as follows when the output voltage of negative voltage generating device 3A is equal to ground potential gnd.

$$vm2=R2/R1\times(-vref)$$

Here, it is assumed that R1=R3 and R2=R4. This DC negative voltage vm2 is output from terminal VM2. At this point, the negative power source voltage of reference voltage generating device 1A is voltage vm2 and the reference voltage is voltage (vm2+vref). Negative voltage generating device 3A generates DC negative voltage vm2 as follows by amplifying the difference between reference voltage (vm2+vref) supplied from reference voltage generating device 1 and its own output voltage vm2.

$$vm2=R2/R1\times\{vm2-(vm2+vref)\}=R2/R1\times(-vref)$$

Here, it is assumed that R1=R3 and R2=R4. There is therefore no change in the output voltage of negative voltage generating device 3A.

Positive voltage generating device 2A is equipped with operational amplifier OP2, resistor R6 and resistor R7 to constitute an inverting amplifier. Positive voltage generating device 2A generates DC positive voltage vp2 as follows by subjecting DC negative voltage vm2 supplied from negative voltage generating device 3A to inverting amplification.

$$vp2=-1\times R7/R6\times vm2$$

This DC positive voltage vp2 is output from terminal VP2.

Figure 5:
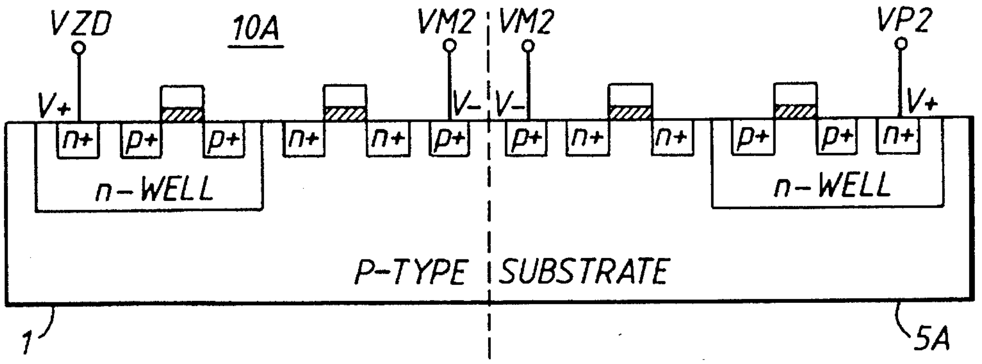
FIG. 5 is a cross-sectional view of LSI 10A in FIG. 4.

FIG. 5 shows a cross-sectional view of LSI 10A in which LSI 5A is integrated with reference voltage generating device 1A. The negative power source voltages of LSI 5A and reference voltage generating device 1A are both DC negative voltage vm2. The positive power source voltage of LSI 5A is DC positive voltage vp2, and the positive power source voltage of reference voltage generating device 1A is primary reference voltage vzd, i.e. these are different. Since these positive power sources are isolated, however, there is no possibility of DC positive voltage vp2 and primary reference voltage vzd getting into a short-circuited condition.

As described above, with this embodiment, LSI 5A and the reference voltage generating device 1A can be integrated, so costs of the power source device can be reduced.

Figure 6:
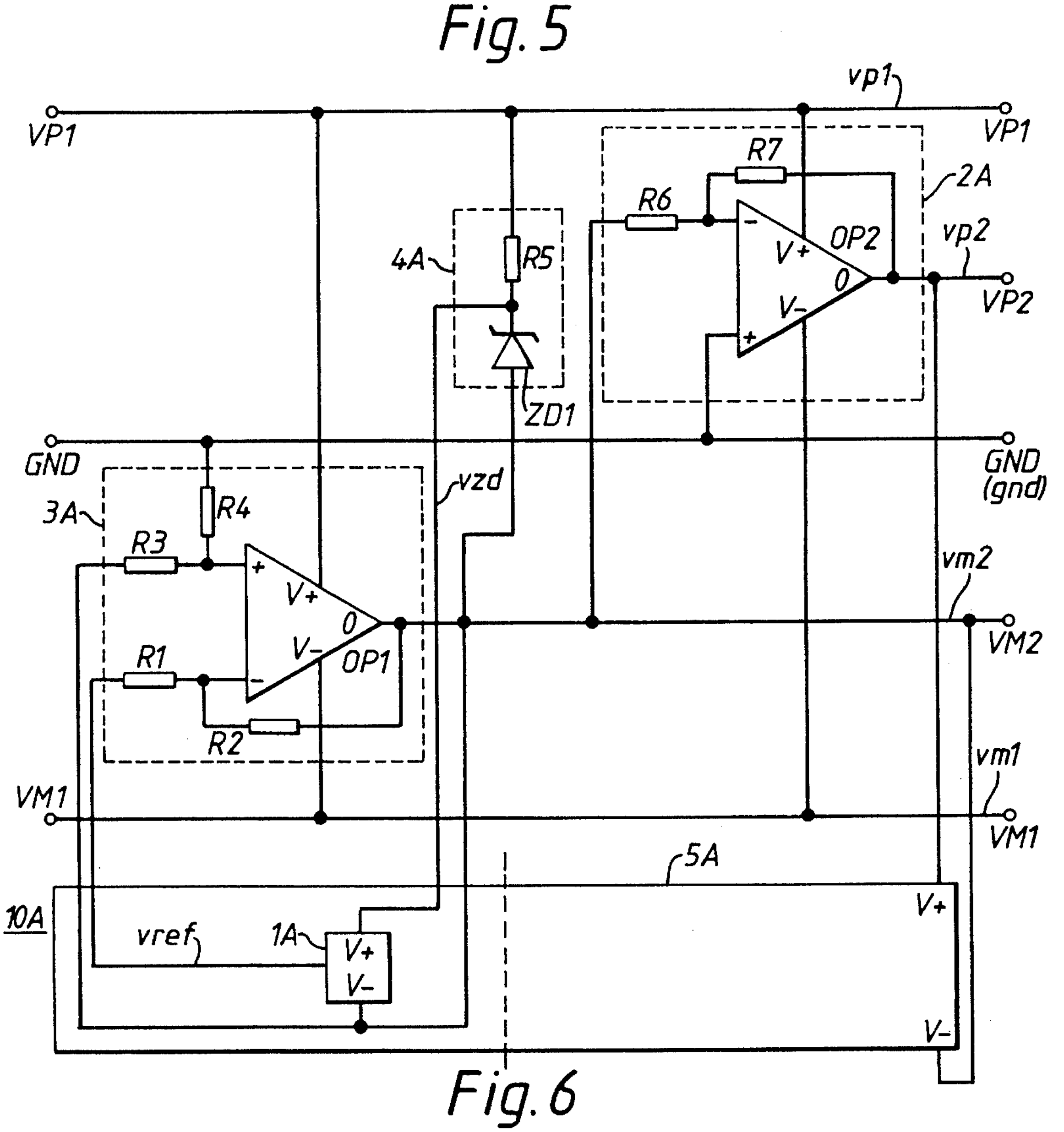
FIG. 6 is a circuit diagram showing a power source device according to a fourth embodiment of this invention.

FIG. 6 is a circuit diagram showing a power source device according to a fourth embodiment of this invention. The point in which this embodiment differs from the third embodiment described above is that the negative voltage source of the primary reference voltage generating device 4A is provided by the output of negative voltage generating device 3A. Primary reference voltage generating device 4A is supplied with primary DC positive voltage vp1 at its terminal VP1. As a result, the positive power source voltage thereof becomes primary DC positive voltage vp1 and the negative power source voltage thereof becomes ground potential gnd. Primary reference voltage vzd is thereby generated by primary reference voltage generating device 4A. At this point, the output voltage of negative voltage generating device 3A is equal to ground potential gnd.

Reference voltage generating device 1A is supplied with primary reference voltage vzd from primary reference voltage generating device 4A. As a result, the positive power source voltage thereof becomes primary reference voltage vzd and the negative power source voltage thereof becomes ground potential gnd, and reference voltage generating device 1A thereby generates reference voltage vref. At this point, the output voltage of negative voltage generating device 3A is equal to ground potential gnd.

Negative voltage generating device 3A is equipped with operating amplifier OP1, resistor R1, resistor R2, resistor R3 and resistor R4, to constitute a differential amplifier. Negative voltage generating device 3A generates DC negative voltage vm2 by amplifying the difference between reference voltage vref that is supplied from reference voltage generating device 1A and its own input voltage vm2.

First of all, when the output voltage of negative voltage generating device 3A is equal to ground potential gnd, DC negative voltage vm2 is generated as follows.

$$vm2=R2/R1\times(-vref)$$

Here, it is assumed that R1=R3 and R2=R4. This DC negative voltage vm2 is output from terminal VM2. At this point, the negative power source voltage of reference voltage generating device 1A is voltage vm2, and the reference voltage is voltage (vm2+vref). Negative voltage generating device 3A generates DC negative voltage vm2 as follows by amplifying the difference between reference voltage (vm2+ vref) that is supplied from reference voltage generating device 1A and its own output voltage vm2.

$$vm2=R2/R1\times\{vm2-(vm2+vref)\}=R2/R1\times(-vref)$$

Here, it is assumed that R1=R3 and R2=R4. There is therefore no change in the output voltage of negative voltage generating device 3A.

Practically the same benefits can therefore by obtained as with the third embodiment described above.

Here, in the third embodiment, in order to make it difficult for LSI 10A to latch up, the value of primary reference voltage vzd must be made (vzd=vm2), so as to make the positive power source voltage of reference voltage generating device 1A equal to the negative power source voltage of LSI 5A. However, when the output voltage of negative voltage generating device 3A is equal to ground potential gnd, the difference between the positive power source voltage and negative power source voltage of reference voltage generating device 1A is (vp2–gnd), i.e. the power source voltage difference is small. Consequently, it is not easy to make the negative power source voltage of reference voltage generating device 1A equal to the negative power source voltage of LSI 5A.

In contrast to the above-described third embodiment, in the fourth embodiment, the value of primary reference voltage vzd may be made (vzd=vm2–vm2) in order to make the positive power source voltage of reference voltage generating device 1A and the positive power source voltage of LSI 5A equal, so as to make it difficult for LSI 10A to latch up. Thus, even when the output voltage of negative voltage generating device 3A is equal to ground potential gnd, the difference between the positive power source and negative power source of reference voltage generating device 1A is voltage (vp2–vm2). The power source voltage difference is sufficiently large so that reference voltage generating device 1A can operate more normally. Consequently, the positive power source voltage of reference voltage generating device 1A and the positive power source voltage of LSI 5A can be made equal, thereby enabling latch up of LSI 10A to be made difficult.

As described above, according to this invention a power source device can be provided which is easy to manufacture with a simple construction.

Furthermore, according to this invention a power source device can be provided whereby cost reduction can be achieved with a simple construction.

Obviously, numerous modifications and variations of the present invention are possible in light of the above teachings. It is therefore to be understood that within the scope of the appended claims, the invention may be practiced otherwise than as specifically described herein.

What is claimed is:

1. A power source device, comprising:

primary reference voltage generating means having a positive power source terminal connected to receive one of ground potential and a DC positive voltage and a negative power source terminal connected to receive a primary DC negative voltage for generating a primary reference voltage;

reference voltage generating means having a positive power source terminal connected to receive said DC positive voltage and a negative power source terminal connected to receive said primary reference voltage for generating a reference voltage;

positive voltage generating means connected to receive said reference voltage and said primary reference voltage for obtaining a difference between said reference voltage and said primary reference voltage and amplifying said difference to generate said DC positive voltage;

negative voltage generating means connected to receive said DC positive voltage for inverting amplifying said DC positive voltage to generate a negative DC voltage; and an integrated circuit having a positive power source terminal connected to receive said DC positive voltage and a negative power source terminal connected to receive said DC negative voltage;

said integrated circuit and said reference voltage generating means being integrated and formed on a n-type substrate; and said negative power source terminal of said integrated circuit being isolated from said negative power source terminal of said reference voltage generating means.

2. The power source device according to claim 1, wherein:

said primary reference voltage generating means has said positive power source terminal connected to said ground potential.

3. The power source device according to claim 1, wherein:

said primary reference voltage generating means has said positive power source terminal connected to receive said DC positive voltage.

4. A power source device, comprising:

primary reference voltage generating means having a positive power source terminal connected to receive a primary DC positive voltage and a negative power source terminal connected to receive one of ground potential and a DC negative voltage for generating a primary reference voltage;

reference voltage generating means having a positive power source terminal connected to receive said primary reference voltage and a negative power source terminal connected to receive said DC negative voltage for generating a reference voltage;

negative voltage generating means connected to receive said reference voltage and said DC negative voltage for obtaining a difference between said reference voltage and said DC negative voltage and amplifying said difference to generate said DC negative voltage;

positive voltage generating means connected to receive said DC negative voltage for inverting amplifying said DC negative voltage to generate a positive DC voltage; and an integrated circuit having a positive power source terminal connected to receive said DC positive voltage and a negative power source terminal connected to receive said DC negative voltage;

said integrated circuit and said reference voltage generating means being integrated and formed on a p-type substrate; and said positive power source terminal of said integrated circuit being isolated from said positive power source terminal of said reference voltage generating means.

5. The power source device according to claim 4, wherein:

said primary reference voltage generating means has said negative power source terminal connected to said ground potential.

6. The power source device according to claim 4, wherein:

said primary reference-voltage generating means has said negative power source terminal connected to receive said DC negative voltage.

* * * * *